US011658001B1

(12) United States Patent
Du et al.

(10) Patent No.: US 11,658,001 B1
(45) Date of Patent: May 23, 2023

(54) ION BEAM CUTTING CALIBRATION SYSTEM AND METHOD

(71) Applicant: INSTITUTE OF GEOLOGY AND GEOPHYSICS, CHINESE ACADEMY OF SCIENCES, Beijing (CN)

(72) Inventors: Zhongming Du, Beijing (CN); Jijin Yang, Beijing (CN)

(73) Assignee: INSTITUTE OF GEOLOGY AND GEOPHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 18/076,429

(22) Filed: Dec. 7, 2022

(51) Int. Cl.
*H01J 37/20* (2006.01)
*H01J 37/31* (2006.01)
(Continued)

(52) U.S. Cl.
CPC .............. *H01J 37/20* (2013.01); *G02B 27/32* (2013.01); *H01J 37/31* (2013.01); *G02B 21/241* (2013.01);
(Continued)

(58) Field of Classification Search
CPC ...... H01J 37/20; H01J 37/31; H01J 2237/026; H01J 2237/20214; H01J 2237/20235;
(Continued)

(56) References Cited

U.S. PATENT DOCUMENTS 5,223,109 A * 6/1993 Itoh ..................... H01J 37/3056
204/298.36
6,714,346 B1 * 3/2004 Neil ..................... H01S 3/0903
359/346

(Continued)

FOREIGN PATENT DOCUMENTS

CN 200982932 Y 11/2007
CN 104183453 A 12/2014
(Continued)

OTHER PUBLICATIONS

Jiang Rong-Rong, et al., Application of broad ion beam polishing method in microanalysis sample preparation, Journal of Chinese Electron Microscopy Society, 2020, pp. 414-422, vol. 39, No. 4.

*Primary Examiner* — David A Vanore
(74) *Attorney, Agent, or Firm* — Bayramoglu Law Offices LLC

(57) ABSTRACT

An ion beam cutting calibration system includes a sample cutting table, a coarse calibration device, a microscopic observation device, and a flip table. The flip table includes a flip plate, which is configured to drive the sample cutting table to swing in a vertical plane. The swing axis of the flip plate is collinear with the side edge of the top surface of the ion beam shielding plate close to the sample. Through the coordinated operation of the flip table, the microscopic observation device, the sample cutting table, and the coarse calibration device, the ion beam cutting calibration system avoids the problem that when the position relationship between the sample and the shielding plate is observed from (Continued)

multiple angles during calibration loading, the sample and the shielding plate are likely to be moved out of the field of vision of the microscope and out of focus.

10 Claims, 8 Drawing Sheets

(51) Int. Cl.
  *G02B 27/32* (2006.01)
  *G02B 25/00* (2006.01)
  *G02B 21/24* (2006.01)
(52) U.S. Cl.
  CPC ....... *G02B 25/001* (2013.01); *H01J 2237/026* (2013.01); *H01J 2237/20214* (2013.01); *H01J 2237/20235* (2013.01); *H01J 2237/30433* (2013.01)
(58) Field of Classification Search
  CPC ........... H01J 2237/30433; G02B 27/32; G02B 21/241; G02B 25/001
  See application file for complete search history.

(56) References Cited

U.S. PATENT DOCUMENTS

| | | | | |
|---|---|---|---|---|
| 6,844,688 B1* | 1/2005 | Williams | ............... | H01S 1/02 |
| | | | | 315/505 |
| 7,859,199 B1* | 12/2010 | Benson | ............... | H05H 7/04 |
| | | | | 315/505 |
| 8,008,633 B2* | 8/2011 | Fujiyoshi | ............... | H01J 37/20 |
| | | | | 250/306 |
| 8,362,430 B1* | 1/2013 | Williams | ........... | G01N 21/3581 |
| | | | | 250/341.1 |
| 8,686,379 B1* | 4/2014 | Robinson | ............... | G01F 23/00 |
| | | | | 250/307 |
| 8,912,490 B2* | 12/2014 | Kelley | ............... | G01N 1/32 |
| | | | | 250/311 |
| 9,209,587 B2* | 12/2015 | Biallas | ............... | G21K 1/10 |
| 9,733,164 B2* | 8/2017 | Wells | ............... | G01N 1/32 |
| 10,088,401 B2* | 10/2018 | Uemoto | ............... | H01J 37/31 |
| 10,896,802 B2* | 1/2021 | Maazouz | ............... | H01J 37/22 |
| 10,930,466 B2* | 2/2021 | Kataoka | ............. | H01J 37/3056 |
| 11,231,349 B1* | 1/2022 | Du | ............... | G01N 1/32 |
| 11,360,037 B1* | 6/2022 | Wu | ............... | G06V 10/764 |
| 11,393,657 B2* | 7/2022 | Shouji | ............... | H01J 37/226 |
| 11,467,301 B1* | 10/2022 | Li | ............... | G01V 1/30 |
| 11,488,801 B1* | 11/2022 | Du | ............... | H01J 37/28 |
| 11,519,866 B1* | 12/2022 | Zhou | ............... | C10L 3/108 |
| 2002/0005492 A1* | 1/2002 | Hashikawa | ............. | H01J 37/20 |
| | | | | 250/442.11 |
| 2004/0108067 A1* | 6/2004 | Fischione | ............... | G01N 1/28 |
| | | | | 156/345.38 |
| 2005/0211922 A1* | 9/2005 | Munekane | ............... | H01J 37/31 |
| | | | | 250/492.21 |
| 2012/0199552 A1* | 8/2012 | Pfeifer | ............... | G01N 1/32 |
| | | | | 156/345.55 |
| 2013/0126750 A1* | 5/2013 | Enomoto | ............... | H01J 37/20 |
| | | | | 250/442.11 |
| 2019/0013178 A1* | 1/2019 | Zachreson | ............. | H01J 37/265 |
| 2019/0259567 A1* | 8/2019 | Takahashi | ............... | H01J 37/20 |

FOREIGN PATENT DOCUMENTS

| | | |
|---|---|---|
| CN | 107199453 A | 9/2017 |
| CN | 107204268 A | 9/2017 |
| CN | 110355455 A | 10/2019 |
| CN | 110605467 A | 12/2019 |
| CN | 110605467 B | 8/2020 |
| CN | 113984484 A | 1/2022 |
| EP | 1870691 A2 | 12/2007 |
| JP | 2004241255 A | 8/2004 |

\* cited by examiner

ION BEAM CUTTING CALIBRATION SYSTEM AND METHOD

CROSS REFERENCE OF THE RELATED APPLICATION

This application claims priority to Chinese application No. 202211149001.3, filed on Sep. 21, 2022, the entire content of which is incorporated herein by reference.

TECHNICAL FIELD

The present disclosure relates to the technical field of polishing and in particular to an ion beam cutting calibration system and method.

BACKGROUND

As a surface treatment device for sample sectioning and plane polishing, the argon ion polishing system is widely used to provide samples with true structures and flat surfaces without foreign substances for surface treatment in the early stage of surface analysis and testing of materials, semiconductor devices, rocks, and minerals. The flat surface eases observation and analysis, thereby improving the accuracy and efficiency of surface analysis and testing. Surface analysis and testing include, but are not limited to, that completed by scanning electron microscope (SEM), electron probe, ion probe, electron backscatter diffraction (EBSD), etc. Ion polishing includes ion beam cutting with an ion beam shielding plate. During cutting, the ion beam shielding plate is located in front of the bearing surface of the sample table to mask the sample to prevent the masked part of the sample from being cut by the argon ion beam. The part of the sample slightly higher than the ion beam shielding plate is the cut part of the sample, and the surface of the cut part of the sample in contact with argon ions forms the ion bombardment surface. The argon ion beam continuously bombards the ion bombardment surface of the sample to remove the sample at the ion bombardment surface. The ion bombardment surface goes further from the side of the sample until a flat cut surface is formed on top of the sample. Therefore, accurate loading has a significant impact on the ion beam cutting effect.

In the prior art, the bottom surface of the sample is usually adhered to the sample holder by a double-sided adhesive tape, and one side surface of the sample is aligned with the reference support plate. The sample holder is transferred to the three-axis translation table, where the up-down, front-back, and left-right positions of the sample are adjusted to make the sample fit with the shielding plate and expose the part of the sample to be removed by ion beam cutting. Chinese patent application CN110605467B provides an ion beam cutting calibration device and method. In this disclosure, when the position relationship between the sample and the shielding plate is observed from multiple angles, the viewing direction is adjusted, and the relative positions and heights of the sample, the shield, and the microscope are changed accordingly. If the sample and the shielding plate are moved out of the field of vision of the microscope and out of focus, the microscope needs to be readjusted, resulting in a complex and inefficient calibration process.

SUMMARY

An objective of the present disclosure is to provide an ion beam cutting calibration system and method. The present disclosure solves the problem that when the position relationship between the sample and the shielding plate is observed from multiple angles during calibration loading, the sample and the shielding plate are likely to be moved out of the field of vision of the microscope and out of focus, resulting in a complex and inefficient calibration process.

To solve the above technical problem, the present disclosure provides the following technical solutions.

A first aspect of the present disclosure provides an ion beam cutting calibration system, which includes a sample cutting table, a coarse calibration device, a microscopic observation device, and a flip table, where the sample cutting table includes a sample holder and an ion beam shielding plate. The sample holder is configured to hold a sample. The ion beam shielding plate is opposite to the sample. At the sample cutting table, the position and angle of the sample relative to the ion beam shielding plate are adjustable. The coarse calibration device is configured to assemble the sample with the sample holder and make the end surface of the sample flush with the end surface of the sample holder. The microscopic observation device includes a microscope, which is provided above the sample holder. A scale is provided in an eyepiece of the microscope. The flip table includes a flip plate, which is connected to the sample cutting table. The flip plate is configured to drive the sample cutting table to swing in a vertical plane. The swing axis of the flip plate is collinear with a side edge of the top surface of the ion beam shielding plate close to the sample.

Further, the flip table includes two pivoting elements, which are arranged on two sides of the flip plate and are connected to the flip plate. The pivoting elements each include a bearing seat, a rotating shaft, and a connecting arm. The connecting arm is connected to the flip plate. The rotating shaft has one end connected to the connecting arm and the other end inserted into and rotationally connected to the bearing seat. A rotation axis of the rotating shaft is provided horizontally and is collinear with the swing axis of the flip plate.

Further, the flip table includes a support frame, which includes upright columns and a bottom plate. The upright columns are arranged vertically, and each has a lower end connected to the bottom plate and an upper end connected to an end of the bearing seat away from the connecting arm. The bottom plate is provided horizontally, and the coarse calibration device and the microscopic observation device are mounted on the bottom plate.

Further, the support frame includes horizontal limit plates and vertical limit plates. The horizontal limit plates are arranged horizontally and are butted against an upper surface of the flip plate when the flip plate is in a horizontal state, and the vertical limit plates are arranged vertically and are butted against a surface of the flip plate away from the sample cutting table when the flip plate is in a vertical state.

Further, the flip table includes a telescopic arm, which has one end hinged to the support frame and the other end hinged to the flip plate; the telescopic arm drives the flip plate to switch between the horizontal state and the vertical state.

Further, the bottom plate is provided with a limit groove, and the sample holder is movable along a length direction of the limit groove when being engaged with the limit groove.

Further, the coarse calibration device includes a coarse calibration positioning plate, which has an end surface to be butted against one end of each of the sample holder and the sample. The end surface of the coarse calibration positioning plate to be butted against the sample holder is vertical to the length direction of the limit groove.

Further, the coarse calibration device includes a leaf spring, which is butted against the end of the sample holder away from the coarse calibration positioning plate; the leaf spring is configured to exert a thrust pointing to the coarse calibration positioning plate on the sample holder.

Further, the sample cutting table includes a first rotating mechanism, a vertical moving mechanism, a second rotating mechanism, and a horizontal moving mechanism. The sample holder is engaged with the first rotating mechanism. The first rotating mechanism is configured to drive the sample holder to rotate in a vertical plane. The vertical moving mechanism is connected to the first rotating mechanism and is configured to drive the first rotating mechanism to move in a vertical direction. The second rotating mechanism is connected to the vertical moving mechanism and is configured to drive the vertical moving mechanism to rotate in a horizontal plane. The horizontal moving mechanism is connected to the second rotating mechanism and is configured to drive the second rotating mechanism to move in a horizontal direction.

A second aspect of the present disclosure provides an ion beam cutting calibration method using above the ion beam cutting calibration system and including the following steps:

coarse calibration loading: placing the sample holder between the leaf spring and the coarse calibration positioning plate, such that the top surface of the sample holder is butted against the coarse calibration positioning plate, and adhering the sample to the sample holder by making the top surface of the sample butted against the coarse calibration positioning plate;

horizontal state calibration: mounting the sample holder on the first rotating mechanism; adjusting the flip plate to the horizontal state, such that the sample is provided vertically; turning on the microscope and adjusting a focal length until the microscope is focused on the top surface of the ion beam shielding plate; adjusting the horizontal moving mechanism to move the sample close to the ion beam shielding plate; adjusting the second rotating mechanism such that projection of the sample and projection of the ion beam shielding plate in the horizontal plane are parallel to each other; and adjusting the horizontal moving mechanism again to fit the sample with the ion beam shielding plate;

vertical state calibration: switching the flip plate to the vertical state; adjusting the first rotating mechanism, such that the projection of the top surface of the sample and projection of the top surface of the ion beam shielding plate in the horizontal plane are parallel to each other; adjusting the vertical moving mechanism through the scale in the microscope to make the top surface of the sample 10-200 µm higher than the top surface of the ion beam shielding plate; and process transfer: removing the sample cutting table from the flip plate and transferring the sample cutting table and the sample together to an ion polishing machine for a polishing process.

Based on the above technical solutions, the present disclosure achieves the following technical effects.

1. In the present disclosure, through the flip table, only one microscope is needed to observe the position relationship between the sample and the ion beam shielding plate in the vertical plane and the horizontal plane, thus improving the calibration efficiency and reducing the cost. The microscope is configured to look in a downward direction. When the flip plate is in the horizontal state, it is observed whether the projection of the sample and the projection of the ion beam shielding plate in the horizontal plane are parallel and whether the distance is appropriate, and the adjustment is performed through the second rotating mechanism and the horizontal moving mechanism. When the flip plate is in the vertical state, it is observed whether the projection of the sample and the projection of the ion beam shielding plate in the vertical plane are parallel and whether the sample that is positioned higher than the ion beam shielding plate is appropriate, and the adjustment is performed through the first rotating mechanism and the vertical moving mechanism. Through the flip table, the present disclosure achieves the observations in the two mutually perpendicular directions through only one microscope without the need for one more microscope, which reduces the equipment cost, avoids refocusing when changing the direction, and improves the calibration efficiency.

In particular, the swing axis of the flip plate is collinear with the side edge of the ion beam shielding plate close to the sample. Therefore, when the flip plate swings to any angle, the relative positions between the microscope and the side edge of the top surface of the ion beam shielding plate close to the sample remain unchanged. The microscope only needs to focus once. When it is focused on the side edge of the top surface of the ion beam shielding plate, it does not need to focus again, which reduces the time for refocusing and greatly improves efficiency. The whole calibration process only requires one focusing and one flipping of the flip plate to complete the adjustment of the position and angle of the sample, simplifying the operation process and improving the work efficiency.

2. The coarse calibration device ensures that the top surface of the sample is relatively flush with the top surface of the sample holder. When the sample is loaded into the sample cutting table, the present disclosure ensures the parallel relationship between the sample and the ion beam shielding plate only by adjusting the angle slightly, which reduces the workload of angle adjustment and improves the calibration efficiency.

3. In the present disclosure, the sample cutting table can adjust the sample in all directions through the first rotating mechanism, the vertical moving mechanism, the second rotating mechanism, and the horizontal moving mechanism and can flexibly and quickly adjust the relative position relationship between the sample and the ion beam shielding plate. The design ensures that the projection of the top surface of the sample and the projection of the top surface of the ion beam shielding plate in the horizontal plane and the vertical plane are parallel and that the size of the sample that is positioned higher than the ion beam shielding plate in the vertical plane is reasonable. Therefore, the present disclosure ensures that the cut surface is flat, the cutting amount is appropriate, and the calibration efficiency and accuracy are improved.

4. In the present disclosure, the first rotating mechanism, the vertical moving mechanism, the second rotating mechanism, and the horizontal moving mechanism are integrated to form a compact structure, which reduces space occupation and eases cooperation with the flip table. In addition, it realizes the close connection between movable parts, reduces the influence of vibration and other factors on the equipment, and thus improves accuracy.

5. In the present disclosure, the sample holder is engaged with the first rotary table, and the first rotary table bears the force. The sample holder avoids bearing the force directly, thereby preventing the sample holder from deformation or position deviation due to the force and further ensuring calibration accuracy. In particular, when the horizontal distance and the vertical distance between the sample holder and the ion beam shielding plate are adjusted, if the thrust is directly exerted on the sample holder, the position of the sample holder will easily deviate, resulting in a gap between the sample holder and the first rotary table, thereby reducing the calibration accuracy.

6. The present disclosure pre-positions the sample through the coarse calibration device and calibrates the position of the sample through the mutual coordination of the sample cutting table, the flip table, and the microscopic observation device, which simplifies the calibration sample loading process and improves the calibration efficiency.

BRIEF DESCRIPTION OF THE DRAWINGS

To describe the technical solutions in the specific implementations of the present disclosure or the prior art more clearly, the accompanying drawings required for describing the specific implementations or the prior art are briefly described below. The accompanying drawings in the following description show merely some implementations of the present disclosure, and a person of ordinary skill in the art may still derive other accompanying drawings from these accompanying drawings without creative efforts.

Figure 1:
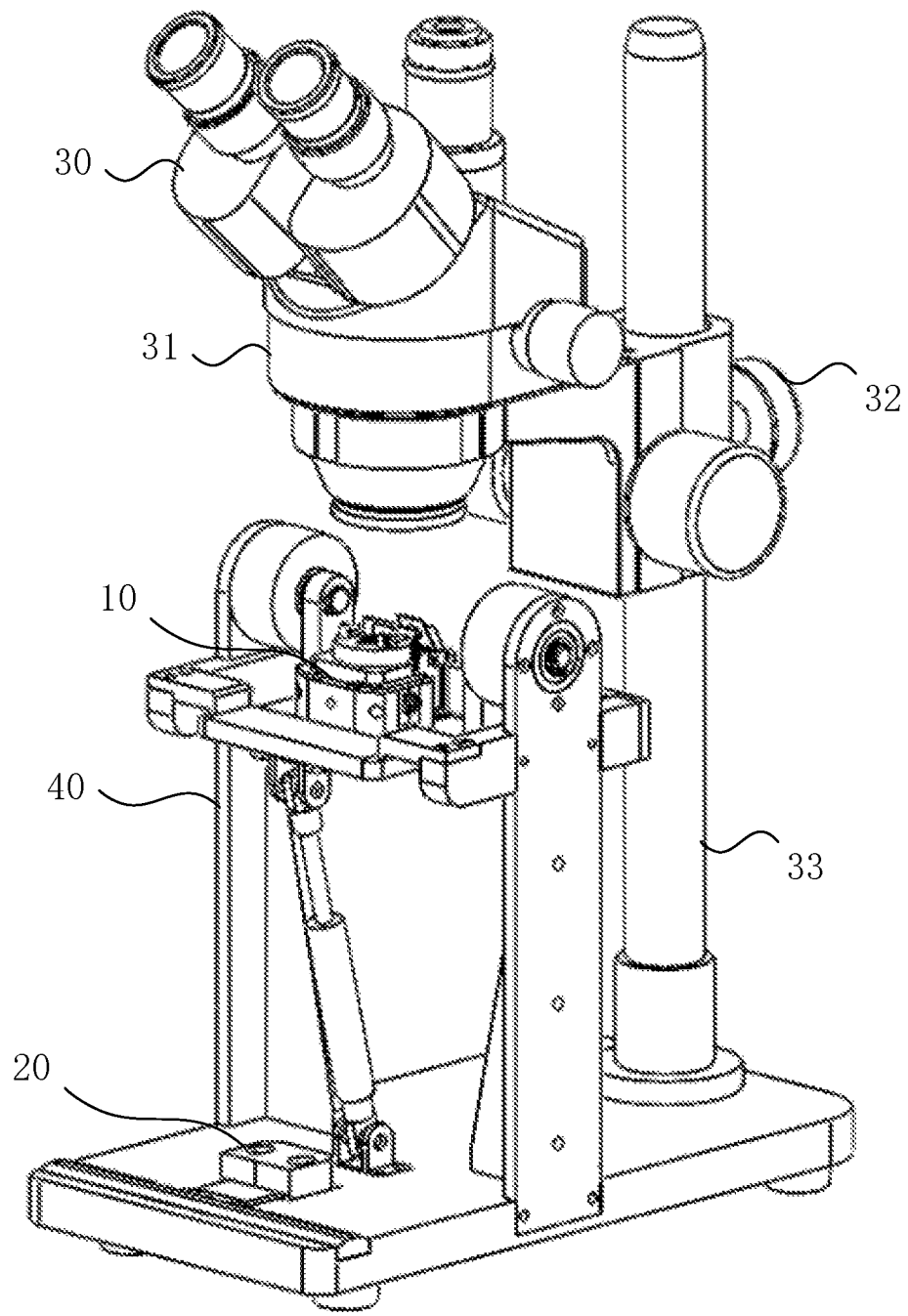
FIG. 1 is a structural view of an ion beam cutting calibration system according to an embodiment of the present disclosure.

Reference Numerals: 10. sample cutting table; 20. coarse calibration device; 30. microscopic observation device; 40. flip table; 100. sample holder; 110. T-shaped protrusion; 120. positioning hole; 200. ion beam shielding mechanism; 210. ion beam shielding plate; 220. shielding plate limit bracket; 300. first rotating mechanism; 310. first rotary table; 320. spring plunger; 311. T-shaped groove; 312. first rotating return protrusion; 313. first rotating flange; 400. vertical moving mechanism; 410. vertical moving slider; 420. first rotary knob; 430. first rotating return spring; 440. first rotating fixing plate; 450. vertical moving guide rail; 460. vertical moving return spring; 411. first sliding groove; 412. vertical moving screw mounting hole; 500. second rotating mechanism; 510. second rotary table; 511. second rotating return protrusion; 512. second rotating flange; 600. horizontal moving mechanism; 610. horizontal moving slider; 620. second rotary knob; 630. second rotating return spring; 640. second rotating fixing plate; 650. horizontal moving guide rail; 660. horizontal moving return spring; 611. second sliding groove; 612. horizontal guide rail connecting protrusion; 700. base; 710. first boss; 720. guide rail bracing; 730. limiting pressure plate; 740. vertical support plate; 750. horizontal moving screw mounting hole; 21. coarse calibration positioning plate; 22. leaf spring; 31. microscope; 32. focusing frame; 33. mounting post; 41. flip plate; 42. support frame; 43. telescopic arm; 44. pivoting element; 45. locking nut; 46. locking screw; 41a. first engaging groove; 41b. positioning boss; 41c. avoidance groove; 42a. horizontal limit plate; 42b. vertical limit plate; 42c. upright columns; 42d. bottom plate; 42e. transverse plate; 42f. limit groove; 44a. bearing seat; 44b. rotating shaft; and 44c. connecting arm.

DETAILED DESCRIPTION OF THE EMBODIMENTS

To make the objectives, technical solutions, and advantages of the embodiments of the present disclosure clear, the technical solutions in the embodiments of the present disclosure will be clearly and completely described below in conjunction with the drawings in the embodiments of the present disclosure. The described embodiments are some, rather than all of the embodiments of the present disclosure. Generally, components of the embodiments of the present disclosure described and shown in the accompanying drawings may be arranged and designed in various manners.

Therefore, the following detailed description of the examples of the present disclosure in the accompanying drawings is not intended to limit the protection scope of the present disclosure but merely represent selected examples of the present disclosure. All other embodiments obtained by those of ordinary skill in the art based on the embodiments of the present disclosure without creative efforts should fall within the protection scope of the present disclosure.

The following describes in detail some implementations of the present disclosure in combination with the accompanying drawings. If no conflict occurs, the following embodiments and features of the embodiments may be combined.

When the position relationship between the sample and the shielding plate is observed from multiple angles during calibration loading, the sample and the shielding plate are moved out of the field of vision of the microscope 31 and out of focus, resulting in a complex and inefficient calibration process.

Given this, the present disclosure provides an ion beam cutting calibration system, including sample cutting table 10, coarse calibration device 20, microscopic observation device 30, and flip table 40. The sample cutting table 10 includes sample holder 100, ion beam shielding mechanism 200, first rotating mechanism 300, vertical moving mechanism 400, second rotating mechanism 500, horizontal moving mechanism 600, and base 700. The sample cutting table 10, the coarse calibration device 20, the microscopic observation device 30, and the flip table 40 cooperate to improve the observation effect and the calibration accuracy and efficiency. The present disclosure avoids the sample and the shielding plate being moved out of the field of vision of the microscope 31 and out of focus in the process of observing the position relationship between the sample and the shielding plate from multiple angles.

The structure and shape of the sample cutting table 10 provided in this embodiment are described in detail below by referring to FIGS. 1 to 12.

Figure 5:
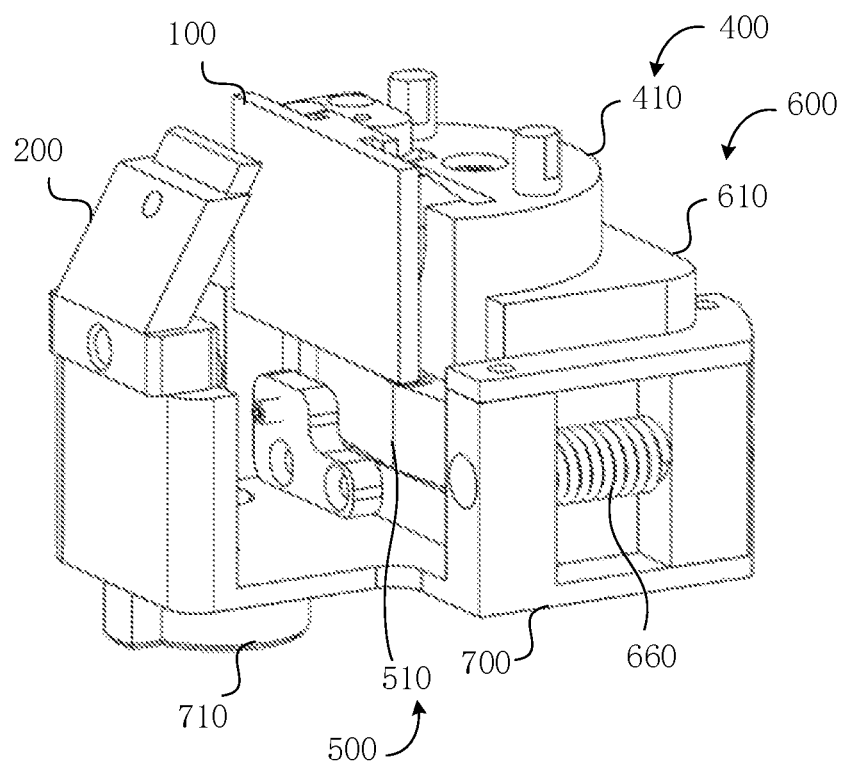
FIG. 5 is a structural view of a sample cutting table.
Figure 10:
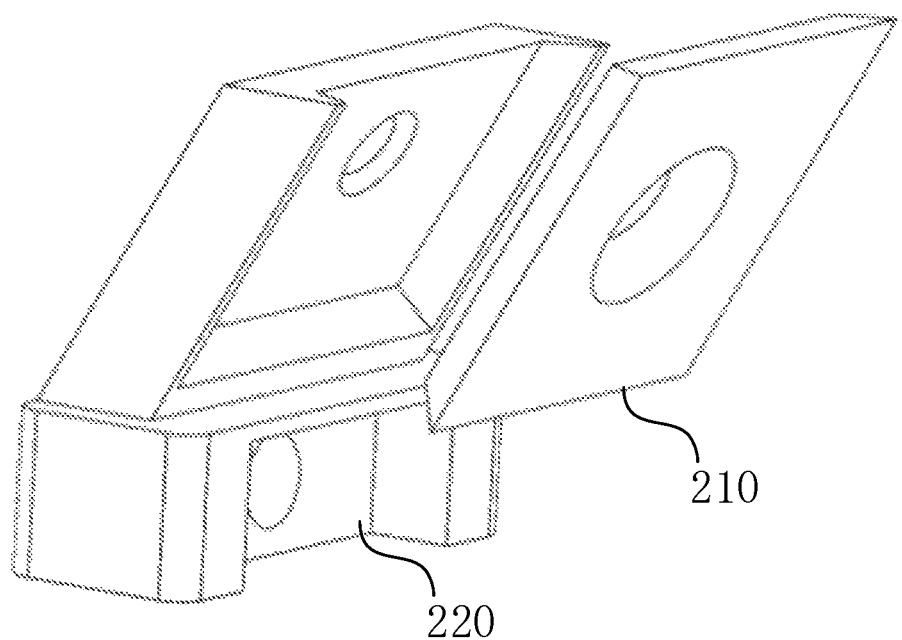
FIG. 10 is a structural view of an ion beam shielding mechanism.
Figure 11:
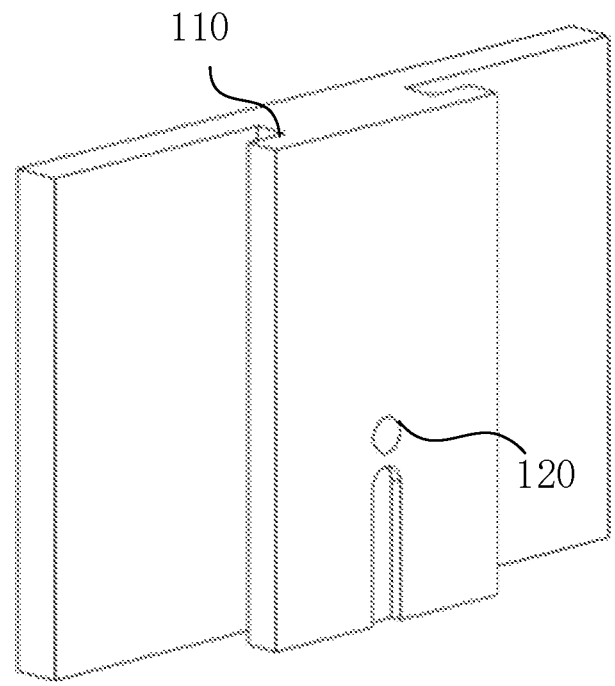
FIG. 11 is a structural view of a sample holder.

In an alternative solution of this embodiment, the ion beam shielding mechanism 200 includes ion beam shielding plate 210 and shielding plate limit bracket 220. As shown in FIGS. 5 and 10, the ion beam shielding plate 210 is inserted into the shielding plate limit bracket 220 and inclined. The top surface of the ion beam shielding plate 210 is provided horizontally to shielding plate an ion beam to protect a part of a sample that does not need to be cut. Specifically, the shielding plate limit bracket 220 is provided with a dovetail groove in which the ion beam shielding plate 210 is inserted. Thus, the ion beam shielding plate 210 is firmly positioned in the shielding plate limit bracket 220.

Further, the ion beam shielding plate 210 and the shielding plate limit bracket 220 are connected by a countersunk screw to prevent the ion beam shielding plate 210 from moving along the length direction of the dovetail groove.

In an alternative solution of this embodiment, the sample holder 100 is provided vertically, and the sample adheres to a side of the sample holder 100 close to the ion beam shielding plate 210.

Figure 7:
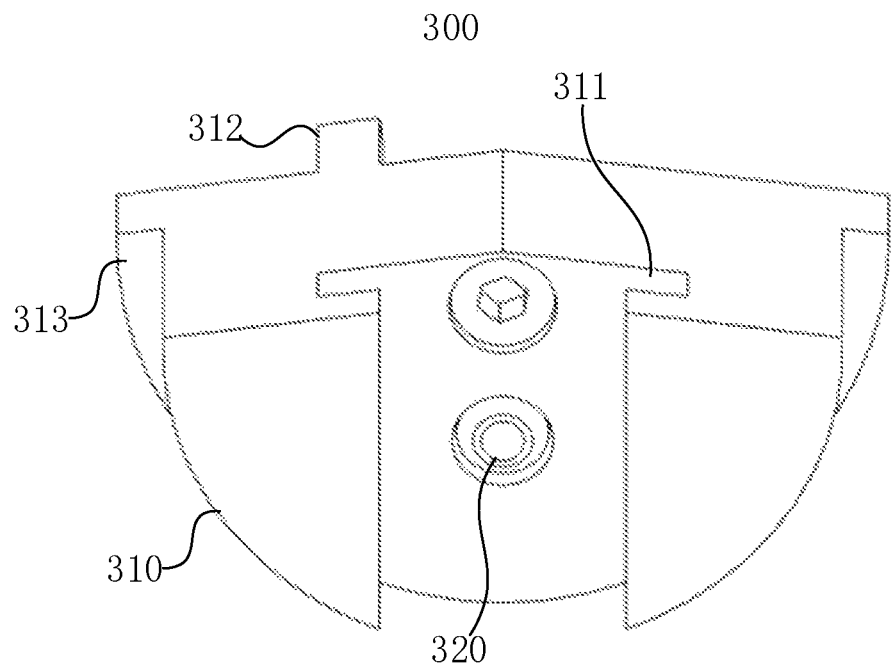
FIG. 7 is a structural view of a first rotary table.

In this embodiment, the first rotating mechanism 300 includes first rotary table 310 and spring plunger 320. As shown in FIGS. 5 and 7, the first rotary table 310 is fan-shaped as a whole and is provided with a shaft hole at the center. The first rotary table rotates around an axis of the shaft hole. The axis of the shaft hole is provided horizontally to drive the sample to swing in a vertical plane in order to adjust the sample in parallel with a projection line of the ion beam shielding plate 210 in the vertical plane. The spring plunger 320 is inserted into the first rotary table 310, and the axis of the spring plunger 320 is parallel to the axis of the shaft hole.

To lock the sample holder 100 to the first rotary table 310, the first rotary table 310 is provided with T-shaped groove 311, and the sample holder 100 is provided with a corresponding T-shaped protrusion 110. As shown in FIG. 7, under the normal state, the T-shaped groove 311 is provided vertically, and the angle is adjusted according to the state of the sample during use. The T-shaped protrusion 110 is inserted into the T-shaped groove 311 for positioning. The sample holder 100 is provided with positioning hole 120. An end of the spring plunger 320 is inserted into the positioning hole 120 to prevent the T-shaped protrusion 110 from moving along the T-shaped groove 311. The end of the spring plunger 320 protrudes from the mating surfaces of the T-shaped groove 311 and the T-shaped protrusion 110.

Figure 8:
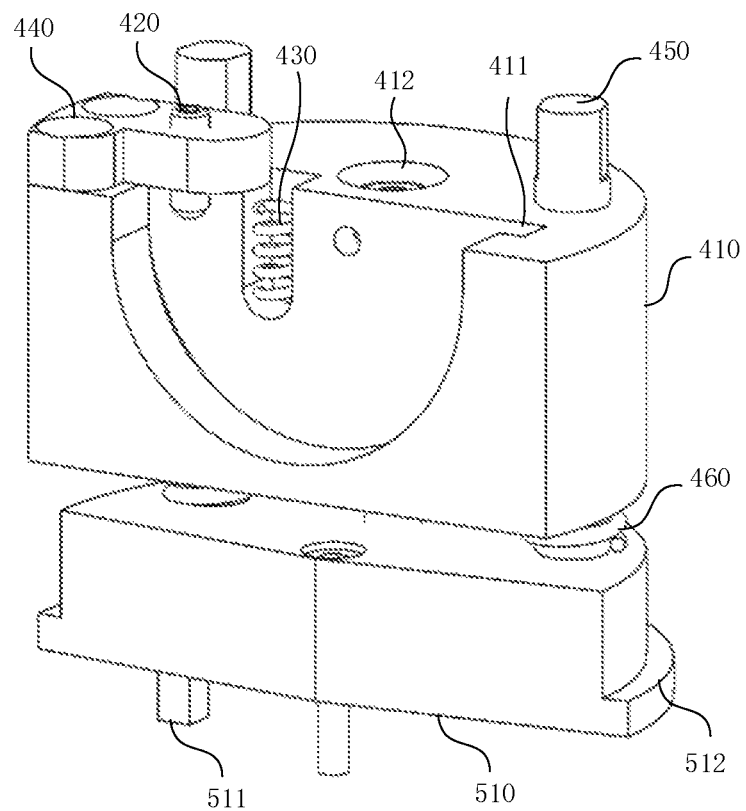
FIG. 8 is a structural view of a second rotary table and a vertical moving slider.

In this embodiment, the vertical moving mechanism 400 includes vertical moving slider 410, first rotary knob 420, first rotating return spring 430, and first rotating fixing plate 440. As shown in FIGS. 5 and 8, the vertical moving slider 410 is provided with a semicircular groove. The first rotary table 310 is provided in the semicircular groove, and the vertical moving slider 410 drives the first rotary table 310 to move in a vertical direction. A rotating shaft is inserted into the shaft hole of the first rotary table 310, and the rotating shaft is also inserted into the vertical moving slider 410. The vertical moving slider 410 is provided with first sliding grooves 411, which are coaxial with and connected to the semicircular groove. Correspondingly, as shown in FIG. 7, the outer edge of the first rotary table 310 is provided with first rotating flanges 313. The first rotating flanges 313 are inserted into the first sliding grooves 411 to guide and limit the rotation of the first rotary table 310 to prevent the first rotary table 310 from shaking, thereby ensuring adjustment accuracy.

Further, the first rotating fixing plate 440 is connected to the vertical moving slider 410. The first rotary knob 420 is mounted on the first rotating fixing plate 440. An axis of the first rotary knob 420 is provided vertically, and one end of the first rotary knob 420 is butted against the first rotary table 310, such that the first rotary table 310 can be driven to rotate by adjusting the first rotary knob 420. Specifically, the first rotary knob 420 is threaded with the first rotating fixing plate 440.

The vertical moving slider 410 is provided with a vertical rotating return groove in which the first rotating return spring 430 is provided. Correspondingly, the first rotary table 310 is provided with a first rotating return protrusion 312. The axis of the first rotating return spring 430 is parallel to the axis of the first rotary knob 420. The first rotating return spring 430 has one end butted against the vertical moving slider 410 and the other end butted against the first rotating return protrusion 312, such that the first rotating return spring 430 exerts a thrust opposite to a thrust exerted by the first rotary knob 420 on the first rotary table 310.

When the first rotary knob 420 is adjusted such that the first rotary knob 420 drives the first rotary table 310 to rotate around the axis of the first rotary table, the first rotating return spring 430 is compressed and provides the opposite thrust to stably position the first rotary table 310. The design avoids shaking the first rotary table and reduces the clearance between parts, thereby improving calibration accuracy. When the first rotary table needs to be rotated reversely, the first rotary knob 420 is adjusted reversely. In this way, the first rotary table 310 is rotated reversely under the thrust of the first rotating return spring 430 and keeps butting against the first rotary knob 420.

In this embodiment, the second rotating mechanism 500 includes second rotary table 510. The second rotary table 510 is fan-shaped as a whole and is provided with a shaft hole at the center. The second rotary table rotates around the axis of the shaft hole. The axis of the shaft hole is provided vertically to drive the sample to swing in a horizontal plane to adjust the projection of the sample and the projection of the ion beam shielding plate 210 in the horizontal plane to be parallel to each other, as shown in FIG. 8.

The vertical moving mechanism 400 further includes vertical moving guide rail 450 and vertical moving return spring 460, as shown in FIG. 8. Specifically, the vertical moving guide rail 450 is vertically inserted into the vertical moving slider 410 and the second rotary table 510. The vertical moving return spring 460 is sleeved on the vertical moving guide rail 450 with the upper end butting against the vertical moving slider 410 and the lower end butting against the second rotary table 510. Specifically, the vertical moving slider 410 is provided with a vertical guide rail hole. The vertical guide rail hole is a stepped hole having a diameter at the lower part that is larger than the diameter at the upper part. The upper part of the stepped hole contacts with the vertical moving guide rail 450, and the lower part thereof is provided with the vertical moving return spring 460. In this way, the vertical moving guide rail 450 and the vertical moving return spring 460 move stably, and a spring thrust keeps a contact surface closely fitted, thereby reducing the clearance and ensuring accuracy. Further, the vertical moving slider 410 is provided with vertical moving screw mounting hole 412. The vertical moving screw mounting hole 412 is a threaded hole for mounting a vertical moving screw. The lower end of the vertical moving screw is smooth and inserted into the second rotary table 510. The vertical moving screw is rotated to drive the vertical moving slider 410 to move along the vertical moving guide rail 450 in the vertical direction to adjust the height of the sample and ensure the sample is higher than the ion beam shielding plate 210 in the vertical direction.

In an alternative solution of this embodiment, the horizontal moving mechanism 600 includes horizontal moving slider 610, second rotary knob 620, second rotating return spring 630, and second rotating fixing plate 640.

Figure 9:
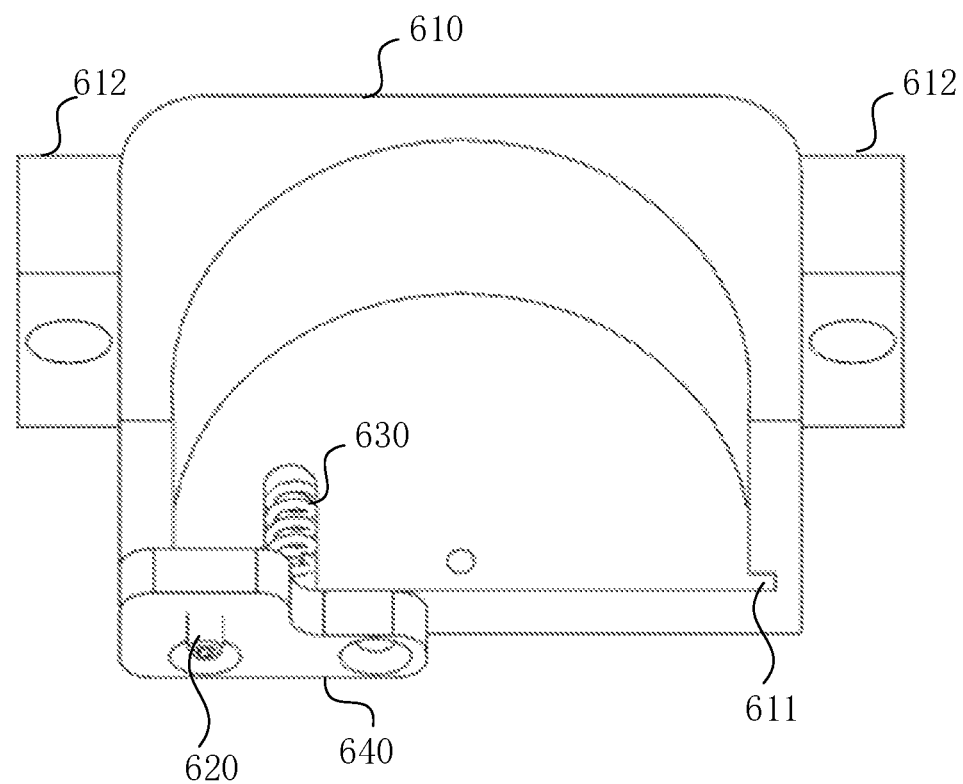
FIG. 9 is a structural view of a horizontal moving slider.

As shown in FIGS. 8 and 9, the horizontal moving slider 610 is provided with a semicircular groove. The second rotary table 510 and the vertical moving slider 410 are arranged in the semicircular groove. The horizontal moving slider 610 drives the second rotary table 510 and the vertical moving slider 410 to move in a horizontal direction. A rotating shaft is inserted into the shaft hole of the second rotary table 510, and the rotating shaft is also inserted into the horizontal moving slider 610. The horizontal moving slider 610 is provided with second sliding grooves 611 that are coaxial with and connected to the semicircular groove. Correspondingly, as shown in FIG. 8, the outer edge of the second rotary table 510 is provided with second rotating flanges 512. The second rotating flanges 512 are inserted into the second sliding grooves 611 to guide and limit the rotation of the second rotary table 510 to prevent the second rotary table 510 from shaking.

Further, the second rotating fixing plate 640 is connected to the horizontal moving slider 610. The second rotary knob 620 is mounted on the second rotating fixing plate 640. The axis of the second rotary knob 620 is provided horizontally, and one end of the second rotary knob 620 is butted against the second rotary table 510, such that the second rotary table 510 can be driven to rotate by adjusting the second rotary knob 620. Specifically, the second rotary knob 620 is threaded with the second rotating fixing plate 640.

The horizontal moving slider 610 is provided with a horizontal groove in which the second rotating return spring 630 is provided. Correspondingly, the second rotary table 510 is provided with second rotating return protrusion 511. The axis of the second rotating return spring 630 is parallel to the axis of the second rotary knob 620. The second rotating return spring 630 has one end butted against the horizontal moving slider 610 and the other end butted against the second rotating return protrusion 511, such that the second rotating return spring 630 exerts a thrust opposite to a thrust exerted by the second rotary knob 620 on the second rotary table 510.

When the second rotary knob 620 is adjusted such that the second rotary knob 620 drives the second rotary table 510 to rotate around the axis of the second rotary table, the second rotating return spring 630 is compressed and provides the opposite thrust to stably position the second rotary table 510. The design avoids shaking the second rotary table and reduces the clearance between parts, thereby improving calibration accuracy. When the second rotary table needs to be rotated reversely, the second rotary knob 620 is adjusted reversely. In this way, the second rotary table 510 is rotated reversely under the thrust of the second rotating return spring 630 and keeps butting against the second rotary knob 620.

In this embodiment, the shielding plate limit bracket 220 and the horizontal moving slider 610 are mounted on the base 700. The lower side of the shielding plate limit bracket 220 is provided with a groove that is open downward, and the base 700 is provided with a corresponding protrusion. The groove and the protrusion are mated to limit the positions of the shielding plate limit bracket 220 and the base 700 and are fixed by a bolt for positioning.

Figure 6:
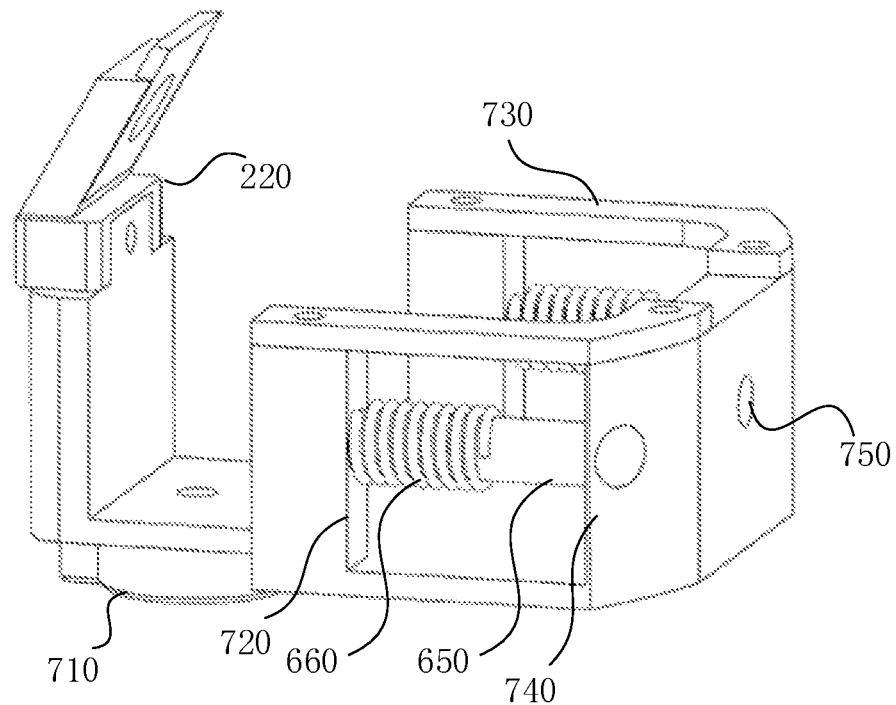
FIG. 6 is a structural view of a base.

In this embodiment, the horizontal moving mechanism 600 further includes horizontal moving guide rail 650 and horizontal moving return spring 660, as shown in FIGS. 5 and 6. Specifically, the horizontal moving guide rail 650 is horizontally inserted into the horizontal moving slider 610, and the horizontal moving guide rail 650 has two ends mounted on the base 700. The horizontal moving return spring 660 is sleeved on the horizontal moving guide rail 650 and has one end butted against the horizontal moving slider 610 and the other end butted against the base 700. Specifically, the horizontal moving slider 610 is provided with horizontal guide rail connecting protrusion 612. The horizontal guide rail connecting protrusion 612 is provided with a through hole, and the horizontal moving guide rail 650 is inserted into the through hole. The horizontal moving return spring 660 is butted against the horizontal guide rail connecting protrusion 612 to keep the position of the horizontal moving slider 610 stable. Further, the base 700 is provided with horizontal moving screw mounting hole 750. The horizontal moving screw mounting hole 750 is a threaded hole and is provided horizontally for mounting a horizontal moving screw. One end of the horizontal moving screw is butted against the horizontal moving slider 610. The horizontal moving screw is rotated to exert a thrust on the horizontal moving slider 610, such that the horizontal moving slider 610 is moved close to the ion beam shielding mechanism 200. The horizontal moving return spring 660 provides an opposite thrust to avoid shaking and reduce the clearance between parts, thereby ensuring stable operation and improving adjustment accuracy. When the horizontal moving slider needs to be moved reversely, the horizontal moving screw is rotated reversely such that the horizontal moving screw is moved far away from the horizontal moving slider 610. The horizontal moving slider 610 is moved away from the ion beam shielding mechanism 200 under the thrust of the horizontal moving return spring 660 and is butted against the horizontal moving screw to adjust the horizontal distance between the sample and the ion beam shielding plate 210. The horizontal moving screw can also be inserted into the horizontal moving slider 610 and threaded with the horizontal moving slider 610. The horizontal moving screw is mounted on the base 700 and is rotated to directly drive the horizontal moving slider 610 to move.

The base 700 further includes guide rail bracing 720, limiting pressure plate 730, and vertical support plate 740. As shown in FIG. 6, the guide rail bracing 720 and the vertical support plate 740 are provided vertically. The two ends of the horizontal moving guide rail 650 are respectively inserted into the guide rail bracing 720 and the vertical support plate 740. The horizontal moving return spring 660 has one end butted against the guide rail bracing 720 and the other end butted against the horizontal guide rail connecting protrusion 612. The limiting pressure plate 730 is connected to the upper ends of the guide rail bracing 720 and the vertical support plate 740 and has a lower surface contacting with the upper surface of the horizontal moving slider 610 to limit the horizontal moving slider 610 to ensure the position accuracy.

In an alternative solution to this embodiment, the flip table 40 includes flip plate 41, support frame 42, telescopic arm 43, and pivoting elements 44.

In this embodiment, as shown in FIGS. 1, 3, 4, and 5, the flip plate 41 is connected to the base 700. A lower end of the base 700 is provided with first boss 710, and the flip plate 41 is provided with a corresponding first engaging groove 41*a*. The first boss 710 is engaged with the first engaging groove 41*a* for positioning and is sequentially inserted into the flip plate 41 and the base 700 through bolts. The first engaging groove 41*a* is provided with a through hole, and the first boss 710 is provided with a corresponding threaded hole located in a center of the first boss 710. The axis of the threaded hole passes through the midpoint of the top surface of the ion beam shielding plate 210 close to the side edge of the sample holder 100. Specifically, the first engaging groove 41*a* is a U-shaped groove, and the first boss 710 is a corresponding U-shaped boss for positioning. The design can prevent the flip plate 41 from rotating relative to the base 700 but ensures that the flip plate 41 flips to drive the base 700 and various mechanisms on the base to flip accordingly.

Further, the flip plate 41 is provided with positioning boss 41*b*. The positioning boss 41*b* is butted against a side of the base 700 and acts together with the first engaging groove 41*a* to reliably fix the base 700 to the flip plate 41.

In an alternative solution of this embodiment, the flip plate 41 can switch between a horizontal state and a vertical state, thereby driving the sample cutting table 10 to switch between the horizontal state and the vertical state. In the vertical state, the ion beam shielding plate 210 is located above the sample holder 100 to avoid shielding the ion beam shielding plate 210 when viewed from above to below to ensure the observation effect.

The telescopic arm 43 has one end hinged to the support frame 42 and the other end hinged to the flip plate 41. The swing of the flip plate 41 is realized through the telescoping of the telescopic arm 43.

Figure 3:
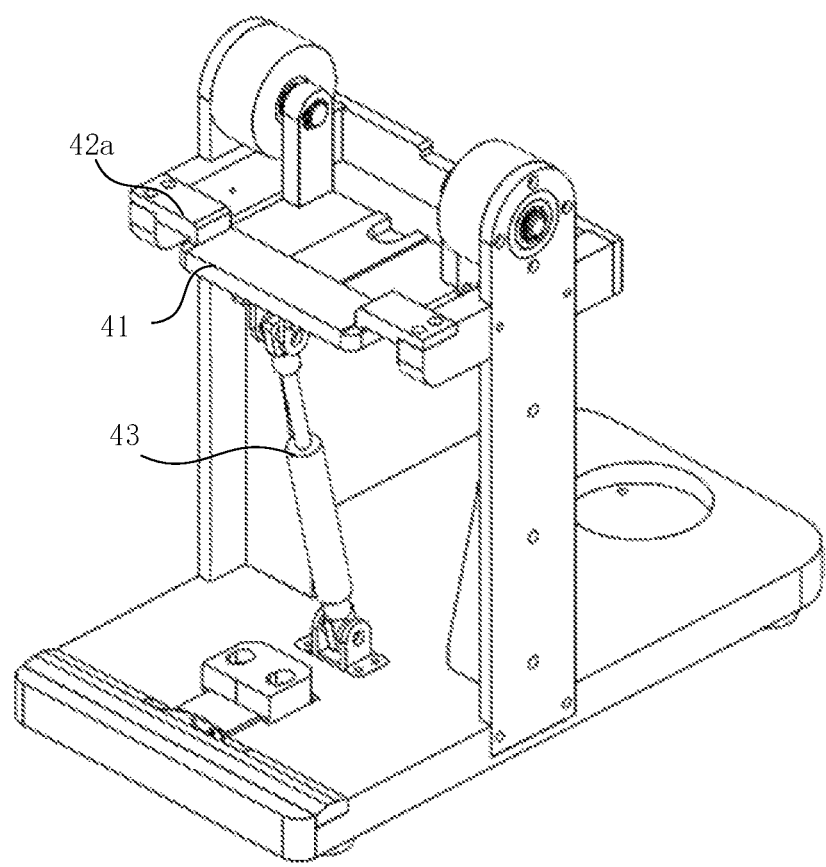
FIG. 3 is a structural view of a flip table.
Figure 4:
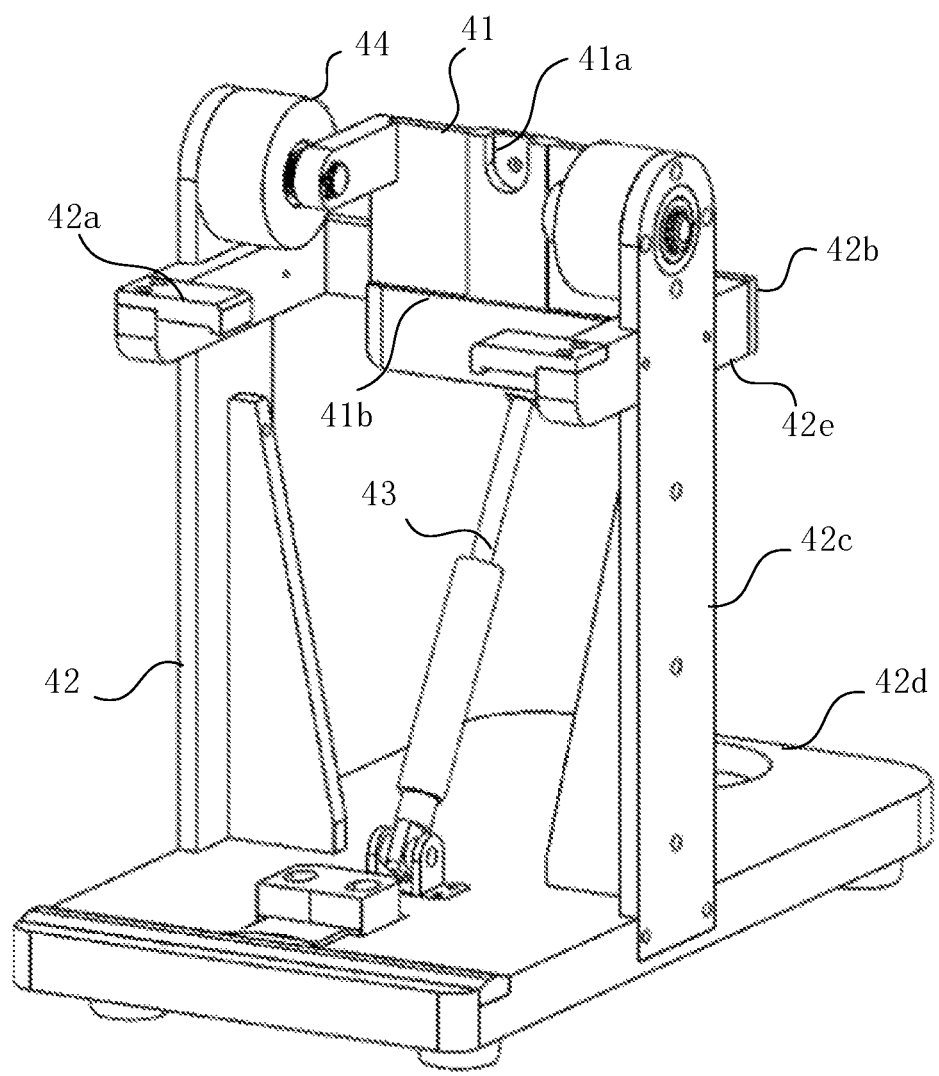
FIG. 4 is a structural view of a flip plate in a vertical state.

The support frame 42 includes horizontal limit plates 42*a*, vertical limit plates 42*b*, upright columns 42*c*, bottom plate 42*d*, and transverse plates 42*e*. As shown in FIG. 4, the two upright columns 42*c* are vertically mounted on the bottom plate 42*d* and parallel to each other, and the two transverse plates 42*e* are respectively connected to the two upright columns 42*c*. The vertical limit plates 42*b* are connected to the ends of the two transverse plates 42*e*. When the flip plate 41 is in the vertical state, the vertical limit plates 42*b* are butted against the flip plate 41 to ensure that the flip plate 41 is in the vertical state. The two horizontal limit plates 42*a* are respectively connected to the two transverse plates 42*e*. When the flip plate 41 is in the horizontal state, lower surfaces of the horizontal limit plates 42*a* are butted against an upper surface of the flip plate 41 to ensure the horizontal state, as shown in FIG. 3.

Figure 12:
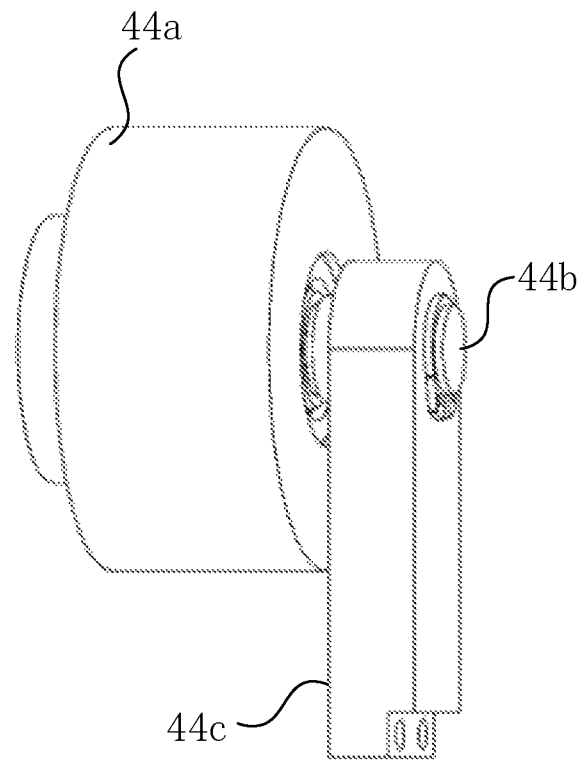
FIG. 12 is a structural view of a pivoting element.

The pivoting elements 44 each include bearing seat 44*a*, rotating shaft 44*b*, and connecting arm 44*c*, as shown in FIG. 12. A lower end of the connecting arm 44*c* is connected to the flip plate 41 and fastened with a screw. The rotating shaft 44*b* is inserted at the upper end of the connecting arm 44*c*. The bearing seat 44*a* is sleeved on the rotating shaft 44*b* and rotationally connected to the rotating shaft 44*b*. A bearing is provided between the bearing seat 44*a* and the rotating shaft 44*b*. An end of bearing seat 44*a* positioned away from the connecting arm 44*c* is connected to the upright columns 42*c*. Specifically, as shown in FIG. 4, the flip plate 41 is connected to the support frame 42 through the pivoting elements 44, and the flipping of the flip plate 41 is realized through the rotational connection between the bearing seat 44*a* and the rotating shaft 44*b*.

It is needed to avoid the front-back observation positions being changed after the flipping to avoid refocusing the microscope 31. When the flip plate 41 is in the horizontal state, the top surface of the ion beam shielding plate 210 and the axis of the rotating shaft 44*b* are in the same horizontal plane. When the flip plate 41 is in the vertical plate, the top surface of the ion beam shielding plate 210 and the axis of the rotating shaft 44*b* are in the same vertical plane. In this way, when observing in these two states, the top surface of the ion beam shielding plate 210 does not change, and there is no need to refocus, thereby improving the calibration efficiency. That is, an edge line of the top surface of the ion beam shielding plate 210 close to the sample holder 100 is collinear with the rotating shaft 44*b*. The axis of the rotating shaft 44*b* forms a swing axis of the flip plate 41. Therefore, the microscope 31 focuses on the axis of the rotating shaft 44*b* when the flip plate 41 is in both the horizontal state and the vertical state.

Figure 13:
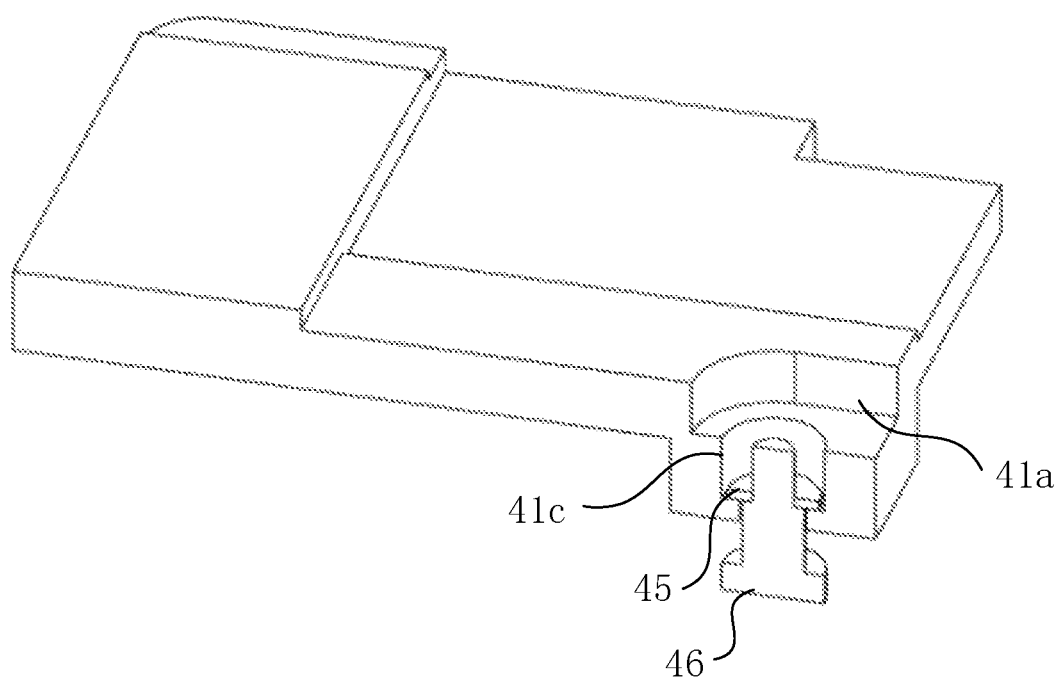
FIG. 13 is a sectional view of the flip plate.

To facilitate the detachable connection between the flip plate 41 and the base 700, the flip table 40 further includes locking nut 45 and locking screw 46, as shown in FIG. 13. The locking screw 46 includes a nut, a smooth section, and a threaded section. Two ends of the smooth section are respectively connected to the nut and the threaded section. The diameter of the smooth section is larger than the diameter of the threaded section and smaller than the diameter of the nut. Correspondingly, the flip plate 41 is provided with avoidance groove 41*c*. The avoidance groove 41*c* has an upper end communicating with a bottom of the first engaging groove 41*a* and a lower end connected to a circular through hole. The threaded section is inserted into the avoidance groove 41*c*, and the smooth section is inserted into the circular through hole. The diameter of the nut is larger than the diameter of the circular through hole. The locking nut 45 is provided in the avoidance groove 41*c* and threaded with the threaded section. The locking nut 45 is butted against the end face of the smooth section. Specifically, the length of the threaded section is less than the depth of the avoidance groove 41*c* and greater than the length of the smooth section minus the length of the circular through hole. FIG. 13 shows the state of the locking screw 46 when the flip plate 41 is separated from the base 700. In this state, the threaded section does not protrude from the bottom of the first engaging groove 41*a*, that is, the threaded section is all located in the avoidance groove 41*c*, and the locking nut 45 prevents the locking screw 46 from being separated from the flip plate 41. When the flip plate 41 is connected to the base 700, since the length of the threaded section is less than the depth of the avoidance groove 41*c*, the first boss 710 and the first engaging groove 41*a* can be directly engaged without interference by the threaded section. The locking screw 46 is rotated to lock the flip plate 41 and the base 700. Since the length of the threaded section is greater than the length of the smooth section minus the length of the circular through hole, the nut is butted against the flip plate 41 to prevent the locking screw 46 from loosening. In short, the locking screw 46 is provided on the flip plate 41 to prevent the locking screw 46 from being lost, which facilitates the connection between the flip plate 41 and the base 700, and these lengths are appropriately set to prevent interference during mounting and ensure the locking effect.

Figure 2:
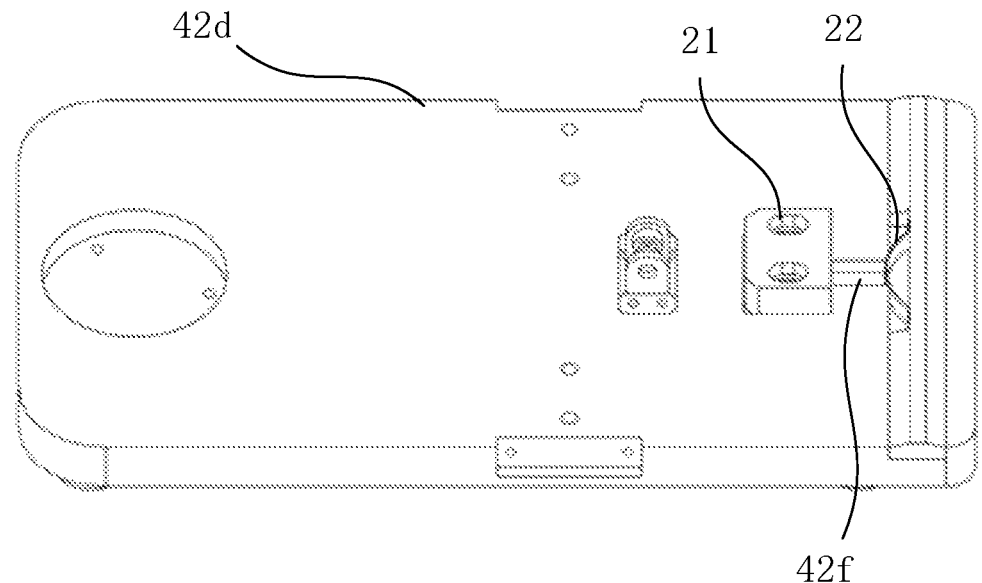
FIG. 2 is a structural view of a coarse calibration device.

In an alternative solution of this embodiment, the coarse calibration device 20 includes coarse calibration positioning plate 21 and leaf spring 22, as shown in FIGS. 1 and 2. The sample holder 100 has one end butted against the coarse calibration positioning plate 21 and the other end butted against the leaf spring 22. The length of the sample holder 100 is greater than the distance between the leaf spring 22 and the coarse calibration positioning plate 21. The leaf spring 22 is configured to exert a thrust pointing to the coarse calibration positioning plate 21 on the sample holder. Specifically, the coarse calibration positioning plate 21 is mounted on the bottom plate 42*d*. The bottom plate 42*d* is provided with limit groove 42*f*, and the sample holder 100 is engaged with the limit groove 42*f* and is movable along the length direction of the limit groove 42*f*. When in use, the top surface of the sample holder 100 is butted against an end surface of the coarse calibration positioning plate 21 under the action of the leaf spring 22. The sample is bonded to the sample holder 100 through glue or conductive tape, and the top surface of the sample is butted against the coarse calibration positioning plate 21, such that the top surface of the sample is flush with the top surface of the sample holder 100 for preliminary calibration. This design reduces the adjustment amount of the first rotating mechanism and the second rotating mechanism, thereby reducing the adjustment workload.

In an alternative solution of this embodiment, the microscopic observation device 30 includes the microscope 31, focusing frame 32, and mounting post 33. As shown in FIG. 1, the microscope 31 is provided above the sample holder. A scale is provided in an eyepiece of the microscope 31 to observe the size of the top surface of the sample higher than the top surface of the ion beam shielding plate 210. The bottom plate 42d is provided with a mounting post positioning hole for fixing the mounting post 33. The microscope 31 is connected to the focusing frame 32. The focusing frame 32 is sleeved on the mounting post 33 and is movable in the vertical direction and rotatable around an axis of the mounting post 33 to adjust the focus.

The use method of the sample cutting table 10 provided in this embodiment is as follows.

The sample holder 100 containing the sample is engaged with the first rotary table 310. The top surfaces of the sample and the ion beam shielding plate 210 refer to the respective upper end surfaces when the flip plate 41 is in the horizontal state.

When the flip plate 41 is in the horizontal state, as shown in FIGS. 1 and 3, the projection of the sample and the projection of the ion beam shielding plate 210 in the horizontal plane are observed, and it is determined whether the projection of the top surface of the sample and the projection of the top surface of the ion beam shielding plate are parallel.

First, when the parallel state is required, the second rotary knob 620 is rotated to push the second rotary table 510 to rotate to drive the vertical moving slider 410 and the first rotary table 310 to rotate in the horizontal plane. In this way, the sample is finally driven to rotate until the projection of the top surface of the sample and the projection of the top surface of the ion beam shielding plate 210 in the horizontal plane are parallel.

Then, the horizontal moving screw is rotated to drive the horizontal moving slider 610 to move along the horizontal moving guide rail 650. The second rotary table 510, the vertical moving slider 410, and the first rotary table 310 are driven to move, so as to adjust the distance between the projection of the top surface of the sample and the projection of the top surface of the ion beam shielding plate 210 in the horizontal plane. Before they are parallel, if the distance between the sample and the ion beam shielding plate 210 is too large, the horizontal moving screw can be rotated to shorten the distance to facilitate the observation of the parallel state.

The telescopic arm 43 is retracted to drive the flip plate 41 to swing downward, and the telescopic arm 43 is extended to push the flip plate 41 to swing continuously until it is butted against the vertical limit plate 42b. At this time, the ion beam shielding plate 210 is located above the sample.

The projection of the sample and the projection of the ion beam shielding plate 210 in the horizontal plane are continuously observed through the microscope 31, and it is determined whether they are parallel and whether the distance is appropriate. When the flip plate 41 is in the horizontal state, the projection of the sample and the projection of the ion beam shielding plate 210 in the vertical plane are observed through an overall swing of 90 degrees. It is unnecessary to provide one more microscope 31 in the horizontal direction for observation.

When the parallel state is required, the first rotary knob 420 is rotated to push the first rotary table 310 to rotate to drive the sample to rotate in the current horizontal plane until the projection of the top surface of the sample and the projection of the top surface of the ion beam shielding plate 210 in the current horizontal plane are parallel.

Then, the vertical moving screw is rotated, and the position of the vertical moving slider 410 is adjusted, so as to drive the first rotary table 310 to move. The distance between the projection of the top surface of the sample and the projection of the top surface of the ion beam shielding plate 210 in the horizontal plane is adjusted to ensure an appropriate cutting amount.

Based on the above ion beam cutting calibration system, the present disclosure further provides an ion beam cutting calibration method, which includes the following steps:

Coarse calibration loading: The sample holder 100 is placed between the leaf spring 22 and the coarse calibration positioning plate 21, such that the top surface of the sample holder 100 is butted against the coarse calibration positioning plate 21. The sample is placed on the sample holder 100, and the top surface of the sample is butted against the coarse calibration positioning plate 21.

Horizontal state calibration: The sample holder 100 is mounted on the first rotary table 310, and the flip plate 41 is adjusted to the horizontal state, such that the sample is provided vertically. The microscope 31 is turned on, and a focal length is adjusted until the microscope 31 is focused on the top surface of the ion beam shielding plate 210. The horizontal moving slider 610 is adjusted to make the sample move close to the ion beam shielding plate 210. When the projection of the sample and the projection of the ion beam shielding plate 210 in the horizontal plane are not parallel, the second rotary table 510 is adjusted until they are parallel. The horizontal moving slider 610 is adjusted again to fit the sample relative to the ion beam shielding plate 210.

Vertical state calibration: The flip plate 41 is switched to the vertical state, and the first rotary table 310 is adjusted until the projection of the top surface of the sample and the projection of the top surface of the ion beam shielding plate 210 in the horizontal plane are parallel. The vertical moving slider 410 is adjusted through the scale in the microscope 31 to make the top surface of the sample 10-200 µm higher than the top surface of the ion beam shielding plate 210.

Process transfer: The sample cutting table 10 is removed from the flip plate 41, and the sample cutting table 10 and the sample are transferred together to an ion polishing machine for a polishing process.

The present disclosure has the following effects.

1. In the present disclosure, through the flip table 40, only one microscope 31 is needed to observe the position relationship between the sample and the ion beam shielding plate 210 in the vertical plane and the horizontal plane, thus improving the calibration efficiency and reducing the cost. The microscope 31 is configured to be viewed in a downward direction. When the flip plate 41 is in the horizontal state, it is observed whether the projection of the sample and the projection of the ion beam shielding plate 210 in the horizontal plane are parallel and whether the distance is appropriate, and the adjustment is performed through the second rotating mechanism 500 and the horizontal moving mechanism 600. When the flip plate 41 is in the vertical state, it is observed whether the projection of the sample and the projection of the ion beam shielding plate 210 in the vertical plane are parallel and whether the size of the sample higher than the ion beam shielding plate 210 is appropriate, and the adjustment is performed through the first rotating mechanism 300 and the vertical moving mechanism 400. Through the flip table 40, the present disclosure achieves the observations in the two mutually perpendicular directions through only one microscope 31 without the need for more microscopes, which reduces the equipment cost, avoids refocusing when changing the direction, and improves calibration efficiency.

In particular, the swing axis of the flip plate 41 is collinear with the side edge of the top surface of the ion beam shielding plate 210 close to the sample. Therefore, when the flip plate 41 swings to any angle, the relative positions between the microscope 31 and the side edge of the top surface of the ion beam shielding plate close to the sample remain unchanged. The microscope 31 only needs to focus once. When it is focused on the side edge of the top surface of the ion beam shielding plate 210, it does not need to focus again, which reduces the time for refocusing and greatly improves efficiency. The whole calibration process only requires one focusing and one flipping of the flip plate 41 to complete the adjustment of the position and angle of the sample, thus simplifying the operation process and improving the work efficiency.

2. The coarse calibration device 20 ensures that the top surface of the sample is relatively flush with the top surface of the sample holder 100. When the sample is loaded into the sample cutting table 10, the present disclosure ensures the parallel relationship between the sample and the ion beam shielding plate 210 only by adjusting the angle slightly, which reduces the workload of angle adjustment and improves the calibration efficiency.

3. In the present disclosure, the sample cutting table 10 can adjust the sample in all directions through the first rotating mechanism 300, the vertical moving mechanism 400, the second rotating mechanism 500, and the horizontal moving mechanism 600 and can flexibly and quickly adjust the relative position relationship between the sample and the ion beam shielding plate 210. The design ensures that the projection of the top surface of the sample and the projection of the top surface of the ion beam shielding plate 210 in the horizontal plane and the vertical plane are parallel and the size of the sample, which is positioned higher than the ion beam shielding plate 210 in the vertical plane, is reasonable. Therefore, the present disclosure ensures that the cut surface is flat, the cutting amount is appropriate, and the calibration efficiency and accuracy are improved.

4. In the present disclosure, the first rotating mechanism 300, the vertical moving mechanism 400, the second rotating mechanism 500, and the horizontal moving mechanism 600 are integrated to form a compact structure, which reduces space occupation and eases cooperation with the flip table 40. In addition, it realizes the close connection between movable parts, reduces the influence of vibration and other factors on the equipment, and thus improves accuracy.

5. In the present disclosure, the sample holder 100 is engaged with the first rotary table 310, and the first rotary table 310 bears the force. The sample holder 100 avoids bearing the force directly, thereby preventing the sample holder 100 from deformation or position deviation due to the force and further ensuring calibration accuracy. In particular, when the horizontal distance and the vertical distance between the sample holder 100 and the ion beam shielding plate 210 are adjusted, if the thrust is directly exerted on the sample holder 100, the position of the sample holder 100 will easily deviate, resulting in a gap between the sample holder 100 and the first rotary table 310, thereby reducing the calibration accuracy.

6. The present disclosure pre-positions the sample through the coarse calibration device 20 and calibrates the position of the sample through the mutual coordination of the sample cutting table 10, the flip table 40, and the microscopic observation device 30, which simplifies the calibration sample loading process and improves calibration efficiency.

Finally, it should be noted that the above embodiments are only intended to illustrate the technical solutions of the present disclosure, rather than to limit the present disclosure. Although the present disclosure is described in detail by referring to the above embodiments, those of ordinary skill in the art should understand that they can still modify the technical solutions described in the above embodiments or make equivalent substitutions to some or all of the technical features therein. However, these modifications or substitutions should not depart from the essence of the corresponding technical solutions or the scope of the technical solutions in the embodiments of the present disclosure.

What is claimed is:

1. An ion beam cutting calibration system, comprising a sample cutting table, a coarse calibration device, a microscopic observation device, and a flip table, wherein the sample cutting table comprises a sample holder and an ion beam shielding plate;
   the sample holder is configured to hold a sample; and the ion beam shielding plate is opposite to the sample;
   at the sample cutting table, a position and an angle of the sample relative to the ion beam shielding plate are adjustable;
   the coarse calibration device is configured to assemble the sample with the sample holder and make an end surface of the sample flush with an end surface of the sample holder;
   the microscopic observation device comprises a microscope, which is provided above the sample holder;
   a scale is provided in an eyepiece of the microscope;
   the flip table comprises a flip plate, which is connected to the sample cutting table;
   the flip plate is configured to drive the sample cutting table to swing in a vertical plane; and
   a swing axis of the flip plate is collinear with a side edge of a top surface of the ion beam shielding plate close to the sample.

2. The ion beam cutting calibration system according to claim 1, wherein the flip table further comprises two pivoting elements, which are arranged at two sides of the flip plate and are connected to the flip plate;
   the pivoting elements each comprise a bearing seat, a rotating shaft, and a connecting arm; the connecting arm is connected to the flip plate; and the rotating shaft has one end connected to the connecting arm and another end inserted into and rotationally connected to the bearing seat; and
   a rotation axis of the rotating shaft is provided horizontally and is collinear with the swing axis of the flip plate.

3. The ion beam cutting calibration system according to claim 2, wherein the flip table further comprises a support frame;
   the support frame comprises upright columns and a bottom plate;
   the upright columns are arranged vertically, and each has a lower end connected to the bottom plate and an upper end connected to an end of the bearing seat away from the connecting arm; and
   the bottom plate is provided horizontally; and the coarse calibration device and the microscopic observation device are mounted on the bottom plate.

4. The ion beam cutting calibration system according to claim 3, wherein the support frame further comprises horizontal limit plates and vertical limit plates;

the horizontal limit plates are arranged horizontally, and are butted against an upper surface of the flip plate when the flip plate is in a horizontal state; and the vertical limit plates are arranged vertically and are butted against a surface of the flip plate away from the sample cutting table when the flip plate is in a vertical state.

5. The ion beam cutting calibration system according to claim 4, wherein the flip table further comprises a telescopic arm, which has one end hinged to the support frame and the other end hinged to the flip plate; and the telescopic arm drives the flip plate to switch between the horizontal state and the vertical state.

6. The ion beam cutting calibration system according to claim 5, wherein the bottom plate is provided with a limit groove; and the sample holder is movable along a length direction of the limit groove when being engaged with the limit groove.

7. The ion beam cutting calibration system according to claim 6, wherein the coarse calibration device comprises a coarse calibration positioning plate, which has an end surface to be butted against one end of each of the sample holder and the sample; and the end surface of the coarse calibration positioning plate to be butted against the sample holder is vertical to the length direction of the limit groove.

8. The ion beam cutting calibration system according to claim 7, wherein the coarse calibration device further comprises a leaf spring, which is butted against an end of the sample holder away from the coarse calibration positioning plate; and the leaf spring is configured to exert a thrust pointing to the coarse calibration positioning plate on the sample holder.

9. The ion beam cutting calibration system according to claim 8, wherein the sample cutting table further comprises a first rotating mechanism, a vertical moving mechanism, a second rotating mechanism, and a horizontal moving mechanism;

the sample holder is engaged with the first rotating mechanism; and the first rotating mechanism is configured to drive the sample holder to rotate in a vertical plane;

the vertical moving mechanism is connected to the first rotating mechanism and is configured to drive the first rotating mechanism to move in a vertical direction;

the second rotating mechanism is connected to the vertical moving mechanism and is configured to drive the vertical moving mechanism to rotate in a horizontal plane; and the horizontal moving mechanism is connected to the second rotating mechanism and is configured to drive the second rotating mechanism to move in a horizontal direction.

10. An ion beam cutting calibration method, using the ion beam cutting calibration system according to claim 9, wherein the ion beam cutting calibration method comprises the following steps:

coarse calibration loading: placing the sample holder between the leaf spring and the coarse calibration positioning plate, such that a top surface of the sample holder is butted against the coarse calibration positioning plate; and adhering the sample to the sample holder by making a top surface of the sample butted against the coarse calibration positioning plate;

horizontal state calibration: mounting the sample holder on the first rotating mechanism; adjusting the flip plate to the horizontal state, such that the sample is provided vertically; turning on the microscope, and adjusting a focal length until the microscope is focused on the top surface of the ion beam shielding plate; adjusting the horizontal moving mechanism to move the sample close to the ion beam shielding plate; adjusting the second rotating mechanism such that projection of the sample and projection of the ion beam shielding plate in the horizontal plane are parallel to each other; and adjusting the horizontal moving mechanism again to fit the sample with the ion beam shielding plate;

vertical state calibration: switching the flip plate to the vertical state; adjusting the first rotating mechanism such that projection of the top surface of the sample and projection of the top surface of the ion beam shielding plate in the horizontal plane are parallel to each other; and adjusting the vertical moving mechanism through the scale in the microscope to make the top surface of the sample 10-200 μm higher than the top surface of the ion beam shielding plate; and process transfer: removing the sample cutting table from the flip plate, and transferring the sample cutting table and the sample together to an ion polishing machine for a polishing process.

* * * * *

UNITED STATES PATENT AND TRADEMARK OFFICE
CERTIFICATE OF CORRECTION

PATENT NO. : 11,658,001 B1  
APPLICATION NO. : 18/076429  
DATED : May 23, 2023  
INVENTOR(S) : Zhongming Du and Jijin Yang Page 1 of 1

It is certified that error appears in the above-identified patent and that said Letters Patent is hereby corrected as shown below:

On the Title Page

Please add the missing Foreign Application Priority Data:
CN 202211149001.3; Priority date 09/21/2022

Signed and Sealed this  
Twenty-sixth Day of September, 2023

Katherine Kelly Vidal  
*Director of the United States Patent and Trademark Office*